United States Patent [19]

Michon

[11] Patent Number: 4,860,073
[45] Date of Patent: Aug. 22, 1989

[54] SOLID STATE IMAGING APPARATUS

[75] Inventor: Gerald J. Michon, Waterford, N.Y.

[73] Assignee: General Electric Company, Schenectady, N.Y.

[21] Appl. No.: 444,933

[22] Filed: Nov. 29, 1982

[51] Int. Cl.[4] .................. H01L 29/78; H01J 40/14
[52] U.S. Cl. .............................. 357/24; 250/211 J
[58] Field of Search ................. 250/211 J; 357/24 LR

[56] References Cited

U.S. PATENT DOCUMENTS

| | | | |
|---|---|---|---|
| 3,805,062 | 4/1974 | Michon et al. | 250/211 |
| 3,935,446 | 1/1976 | Michon | 250/211 |
| 3,993,897 | 11/1976 | Burke et al. | 250/211 |
| 4,240,116 | 12/1980 | Tomlinson | 357/24 LR |
| 4,375,597 | 3/1983 | Kosonocky | 357/24 LR |
| 4,388,532 | 6/1983 | Garcia | 357/24 LR |
| 4,404,466 | 9/1983 | Harada | 357/24 LR |

Primary Examiner—Stephen C. Buczinski
Attorney, Agent, or Firm—Marvin Snyder; James C. Davis, Jr.

[57] ABSTRACT

An array of charge storage devices each including a pair of closely coupled conductor-insulator-semiconductor capacitors or cells, one a row line connected cell and the other a column line connected cell, is provided on a common semiconductor substrate. The charge stored in a row of devices is read out by transferring charge from a column cell to a row cell and then back again to the column cell by reducing and then increasing the absolute value of the voltage on column cell of each of the devices of the row in sequence. The resultant change in voltage produced on the row line is sensed and an electrical signal is obtained representing the charge stored at each of the devices of the row. During the readout operation the voltage on each of the column cells is reduced to below threshold voltage of the cells to allow the fixed amount of charge trapped in the surface states of each of the column cells to recombine with majority carriers in the substrate thereby reducing the charge stored in each of the devices of the array by this fixed amount of charge.

8 Claims, 6 Drawing Sheets

SOLID STATE IMAGING APPARATUS

The present invention relates to apparatus for sensing patterns of radiation imaged thereon and developing electrical signals in accordance therewith. The present invention relates in particular to such apparatus which stores charge produced by electromagnetic radiation flux in the form of localized charges in a semiconductor substrate and which provides an electrical readout of the stored charge.

This application relates to improvements in the apparatus of U.S. Pat. No. 3,805,062 and U.S. Pat. No. 3,935,446 both of which are assigned to the assignee of the present application and both of which are incorporated herein by reference thereto.

Radiation sensing apparatus such as referred to above include an array of charge storage devices on a common semiconductor substrate. A number of image sensing applications require detection of a relatively small signal in the presence of a large background level. Star sensing during daylight hours, star sensing in the presence of background gamma radiation, and infrared sensing applications are examples. The total charge signal plus background that can be integrated is limited by the storage capacity of the charge storage devices of the array.

The present invention is particularly directed to overcoming such limitations in solid state imaging apparatus.

A general object of the present invention is to provide improvements in solid state imaging apparatus.

In carrying out the invention in one illustrative embodiment thereof there is provided substrate of semiconductor material of one conductivity type having a major surface. A plurality of first conductive plates are provided, each overlying and in insulated relationship to the major surface and forming a first conductor-insulator-semiconductor capacitor with the substrate. A plurality of second conductive plates are provided, each adjacent a respective first conductive plate to form a plurality of pairs of plates, the pairs of plates being arranged in a matrix of rows and columns, each of the second conductive plates overlying and in insulated relationship to the major surface and forming a second conductor-insulator-semiconductor capacitor with the substrate. Each second conductor-insulator-semiconductor capacitor is coupled to a respective first conductor-insulator-semiconductor capacitor so as to permit the transfer of stored charge between them. A plurality of row conductor lines are provided, the first conductive plates in each of the rows are connected to a respective row conductor line. A plurality of column conductor lines are provided, the second conductive plates in each of the columns are connected to a respective column conductor line.

A first voltage means provides a first voltage between the row conductor lines and the substrate to deplete respective first portions of the substrate lying thereunder of majority charge carriers and provides an absolute potential of a first value therein. A second voltage means provides a second voltage between the column conductor lines and the substrate to deplete respective second portions of the substrate lying thereunder of majority charge carriers and provides an absolute potential of a second value therein. Means are provided for storing charge in the second portions of the substrate. Means are provided for reducing on each of the column conductor lines in sequence the second voltage to a first level and thereafter reestablishing the second voltage during a respective first period of time to cause the second portions of the substrate to be reduced in absolute potential to a third value less than the second value whereby charge in each of the second portions of said substrate transfers into a respective first portion of the substrate and back. Means are provided for sensing in sequence the signals induced on a row line during the transfer of charge from the second portions to the first portions of the substrate associated with the row line during a second period of time. The third value is the potential of the substrate at which majority carriers from the substrate combine with charge trapped in interface states. When the second voltage is reapplied, a fixed quantity of each packet of charge transferred from a respective first portion to a respective second portion of the substrate functions to fill the states at the surface of a respective second portion of the substrate with charge thereby diminishing each packet of charge by the aforementioned fixed quantity of charge.

The novel features which are believed to be characteristic of the present invention are set forth with particularity in appended claims. The invention itself, both as to its organization and method of operation, together with further objects and advantages thereof may best be understood by reference to the following description taken in connection with the accompanying drawings wherein:

Figure 1:
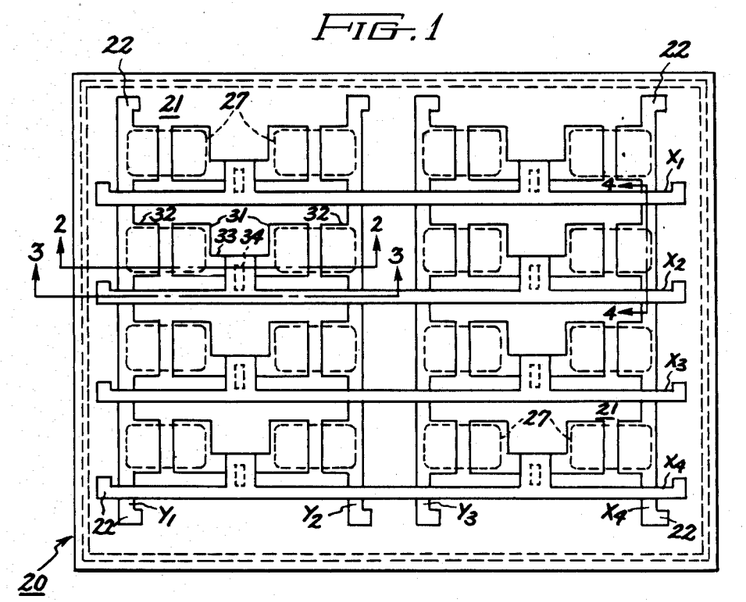
FIG. 1 is a plan view of an array or assembly of charge storage devices incorporated in the apparatus of the present invention shown in FIG. 5.
Figure 2:
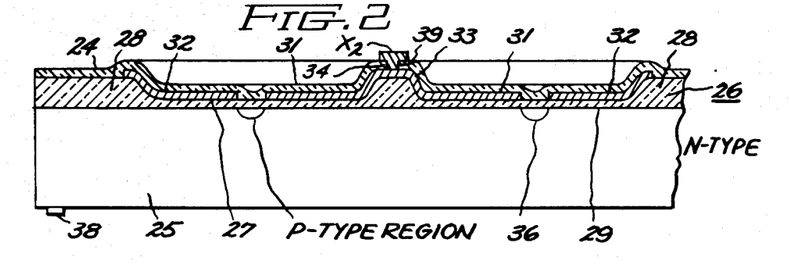
FIG. 2 is a sectional view of the assembly of FIG. 1 taken along section lines 2—2 of FIG. 1.
Figures 3, 4:
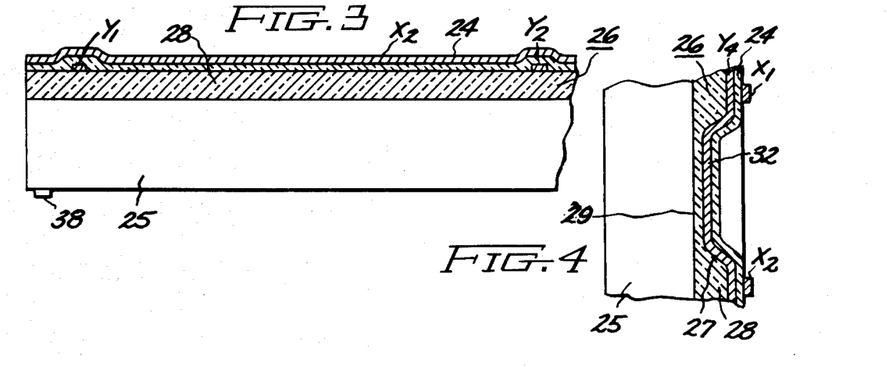
FIG. 3 is a sectional view of the assembly of FIG. 1 taken along section lines 3—3 of FIG. 1.
FIG. 4 is a sectional view of the assembly of FIG. 1 taken along section lines 4—4 of FIG. 1.
Figure 5:
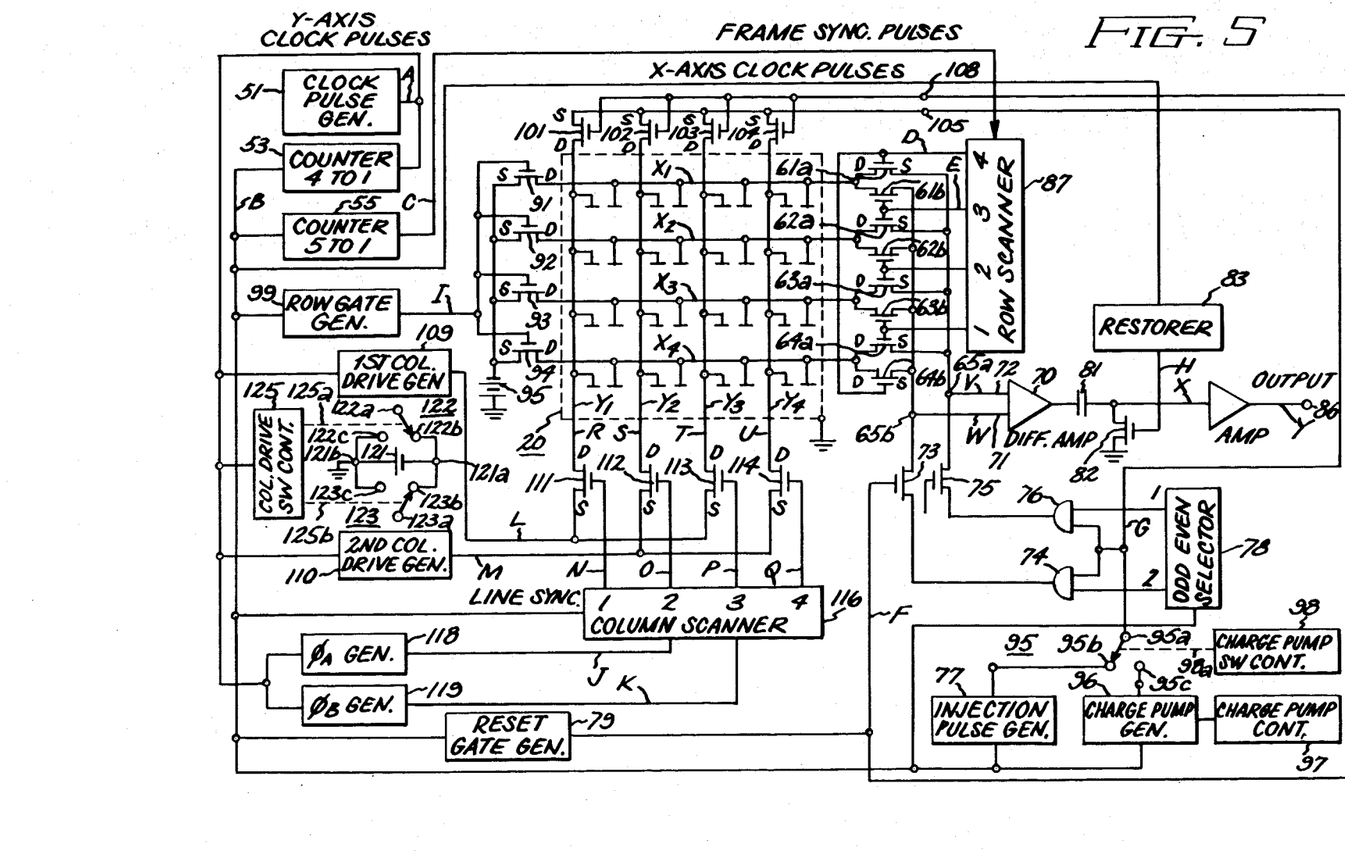
FIG. 5 is a block diagram of an image sensing apparatus in accordance with the present invention.

Before proceeding to describe the apparatus of FIG. 5 embodying the present invention the array of charge storage and radiation sensing devices used in the apparatus will be described. While a specific form of the array fabricated using a specific technology is shown and described, it will be understood that the array utilized in the apparatus may take on other forms and that any of the commonly used technologies for charge transfer devices may be used in the fabrication thereof. Reference is now made to FIGS. 1-4 which show an array 20 of charge storage and radiation sensing devices 21, such as the device described in FIGS. 2A, 2B and 2C. of aforementioned U.S. Pat. No. 3,805,062 arranged in four rows and columns. The array includes four row conductor lines, each connecting the row-oriented plates of a respective row of devices, and are designated from top to bottom $X_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs provided at each end of each of the lines. While in FIG. 1 the row conductor lines appear to cross the column conductor lines, the row conductor lines are insulated from the column lines by a layer 24 of transparent glass as is readily apparent in FIGS. 2, 3 and 4. In FIG. 1 the outline of the structure underlying the glass layer 24 is shown in solid outline for reasons of clarity.

The array includes a substrate or wafer 25 of semiconductor material of N-type conductivity over which is provided an insulating layer 26 contacting a major face of the substrate 25. A plurality of deep recesses 27 are provided in the insulating layer, each for a respective device 21. Accordingly, the insulating layer 26 is provided with thick or ridge portions 28 surrounding a plurality of thin portions 29 in the bottom of the recesses. In each of the recesses is situated a pair of substantially identical conductive plates or conductive members 31 and 32 of rectangular outline. Plate 31 is denoted a row-oriented plate and plate 32 is denoted a column oriented plate. The plates 31 and 32 of a device 21 are spaced close to one another along the direction of a row and with adjacent edges substantially parallel. In proceeding from the left hand portion of the array to the right hand portion, the row-oriented plates 31 alternate in lateral position with respect to the column oriented plates 32. Accordingly, the row-oriented plates 31 of pairs of adjacent devices of a row are adjacent and are connected together by a conductor 33 formed integral with the formation of the plates 31. With such an arrangement a single connection 34 from a row conductor line through a hole 39 in the aforementioned glass layer 24 is made to the conductor 33 connecting a pair of row-oriented plates. The column-oriented conductor lines are formed integrally with the formation of the column-oriented plates 32. The surface adjacent portion of the substrate 25 underlying the space between the plates 31 and 32 of each device 21 is provided with a P-type conductivity region 36. The glass layer 24 overlies the thick portion 28 and thin portion 29 of the insulating layer 26 and the plates 31 and 32, conductors 33 and column-oriented conductor lines $Y_1$–$Y_4$ thereof except for the contact tabs 22 thereof. The glass layer 24 may contain an acceptor activator and may be utilized in the formation of the P-type region 36. A ring shaped electrode 38 is secured to the major surface of the substrate opposite the major surface on which the devices 21 were formed and provides conductive connection to the substrate. Such a connection to the substrate permits rear face as well as front face illumination of the array.

The array 20 and the devices 21 of which they are comprised may be fabricated using a variety of materials and in variety of sizes in accordance with established techniques for fabricating integrated circuits as described in the aforementioned U.S. Pat. No. 3,805,062.

In the operation of the array described in connection with FIGS. 1–4, the charge stored in the columns and row oriented capacitors of each of the devices may be read out in various ways. Depletion producing voltages are applied to the column and row lines of the array and the array is exposed to a pattern of radiation thereby accumulating charge in the capacitors of each of the devices of the array. The charge stored in a row of devices is read out by transferring charge from a column storage capacitor to a row storage capacitor and then back again to the column storage capacitor by reducing and then increasing the absolute value of the voltage on the column capacitor plate of each of the devices of the row in sequence. The resultant change in voltage produced on the row line is sensed and an electrical signal is obtained representing the charge stored at each of the devices of the row. During the readout operation care is taken to keep the minimum voltage on the column storage capacitors larger than the threshold voltage of the column storage capacitor to avoid loss of charge stored therein resulting from charge pumping. Charge pumping refers to the loss of charge captured at the interface states of CIS capacitors when voltage is applied to capacitors to produce depletion in the semiconductor substrate of the capacitor. (See "Charge Pumping in MOS Devices", J.S. Brugler and P.G.A. Jespers, IEEE Transactions on Electron Devices, Vol. ED-16, No. 3, March 1969). In the example described above, if the voltage on the column capacitor were switched to a value below the threshold voltage of the CIS capacitor, i.e. to zero volts, minority carrier charge trapped at the semiconductor-insulator interface would combine with the majority carrier conduction charge and be lost. Subsequent re-application of full voltage would allow mobile charge that had previously transferred to the row storage capacitor to return to the column storage capacitor. A portion of this mobile charge would be trapped at the interface states that were just emptied, effectively removing this quantity of charge from the mobile charge packet.

The quantity of charge removed or pumped is equal to the product of the interface state density $N_{st}$, the area of the capacitor and the number of recombination cycles utilized. In accordance with the present invention the fraction of the charge removed from the array prior to read out of the array is controlled by controlling the fraction of the charge transfer cycles in which the drive voltage is dropped below threshold voltage of the capacitors.

The apparatus will be described in connection with FIGS. 6A–6Y which show diagram of amplitude versus time of signals occurring at various points in the system of FIG. 5. The point of occurrence of a signal of FIGS. 6A–6Y is referenced in FIG. 5 by a literal designation corresponding to the literal designation of the figure reference.

Figure 6A:
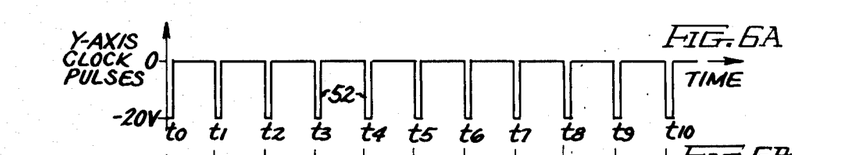
FIGS. 6A through 6Y are diagrams of amplitude versus time of voltage signals occurring at various points in the apparatus of FIG. 5 in accordance with one mode of operation thereof. The point of occurrence of a signal of FIGS. 6A–6Y in the block diagram of FIG. 5 is identified in FIG. 5 by a literal designation corresponding to the literal designation of the FIGS. 6A–6Y.
Figure 6B:
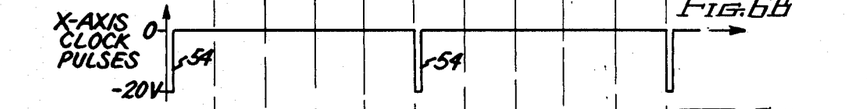
Figure 6C:
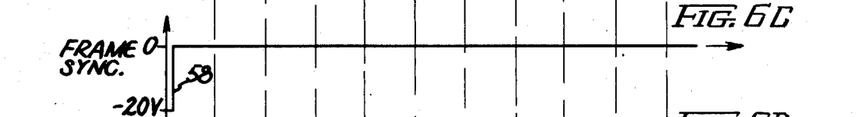
Figure 6D:
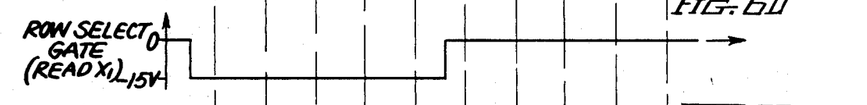
Figure 6E:
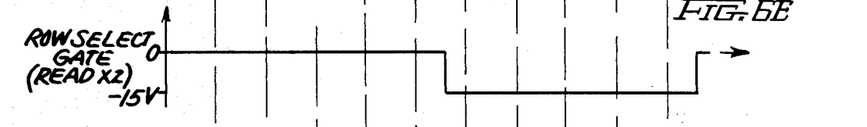

The apparatus includes a clock pulse generator 51 which develops a series of regularly occurring Y-axis pulses 52 of short duration shown in FIG. 6A, occurring in sequence at instants of time $t_0$–$t_{10}$ and representing a half scanning cycle of operation of the array. The output of the clock pulse generator 51 is applied to a first counter 53 which divides the count of the clock pulse generator by four to derive X-axis clock pulses 54, such as shown in FIG. 6B. The output of the first counter 53 is also applied to a second counter 55 which further divides the count applied to it by five to provide frame synchronizing pulses 56 of FIG. 6C to the array.

The sensing array 20, which is identical to the sensing array of FIG. 1 and is identically designated, includes row conductor lines $X_1$ through $X_4$ and column conductor lines $Y_1$ through $Y_4$. The drive circuits for the row conductor lines $X_1$–$X_4$ and for the column conductor lines $Y_1$–$Y_4$ of array 20 are included on the same substrate 50 as the array to minimize the number of external connections which are required to be made for connection of the array 20 in the system.

To enable selective read out of a row of devices a plurality of pairs of row-enable switches 61a–64a and 61b–64b are provided. The row-enable switches 61a–64a and 61b–64b are in the form of MOSFET transistor devices formed integrally on the substrate, each having a source electrode, a drain electrode and a gate electrode. Each of the drains of the devices 61a–64a and each of the drains of the devices of 61b–64b is connected to one end of a respective one of the row conductor lines $X_1$–$X_4$. Each of the sources of the devices 61a–64a is connected to row bias terminal 65a. Each of the sources of devices 61b–64b is connected to row bias terminal 65b. The terminal 65b is connected to the inverting terminal 71 of a differential amplifier 70. The output terminal 65a is connected to the noninverting 72 terminal of the differential amplifier 70. A change in voltage at the inverting input terminal of the differential amplifier in one direction in relation to a reference potential produces a change in voltage at the output terminal in the opposite direction in relation to the reference potential. A change in voltage at the non-inverting terminal in one direction in relation to a reference potential produces a change in voltage at the output terminal in the same direction in relation to the reference potential.

The terminal 65b is connected through the source-drain conduction path of reset transistor 73 to the output of the AND gate 74. The terminal 65a is connected through the source-drain conduction path of the reset transistor 75 to the output of the AND gate 76. The AND gate 74 has a pair of input terminals one of which is connected to the pole terminal 95a of single pole-double throw switch 95 having in addition a first contact terminal 95b and a second contact terminal 95c. The first contact terminal is connected to the output of the injection pulse generator 77 from which the injection pulses 77a of FIG. 6G are obtained. The injection pulse generator 77 is synchronized with the X-axis clock pulses. The other input terminal of the AND gate 74 is connected to the even terminal, designated terminal 2, of the odd-even selector 78 which provides a pair of outputs at termnals 1 and 2. The AND gate 76 also has pair of input terminals one of which is connected to the output of the injection pulse generator 77 through switch 95 and the other input terminal of which is connected to the odd terminal, designated terminal 1, of the odd-even selector 78. The odd-even selector 78 is synchronized with the X-axis clock pulses and provides an output on terminal 1 during the scanning of the odd lines of the array and an output on terminal 2 during the scanning of the even rows of the array. The AND gates 74 and 76 are set so that a row readout potential of −6 volts appear at the outputs thereof in the absence of a pair of signals at the input thereof. During the scanning of an odd numbered row of the array the AND gate 76 provides a voltage output equal to the threshold voltage of the row storage capacitors during the occurrence of the injection pulses 77a of FIG. 6G. During the scanning of an even numbered row of the array the AND gate 74 provides a voltage output equal to the threshold voltage of the storage capacitors during the occurrence of the injection pulses 77a of FIG. 6G.

Figure 6F:
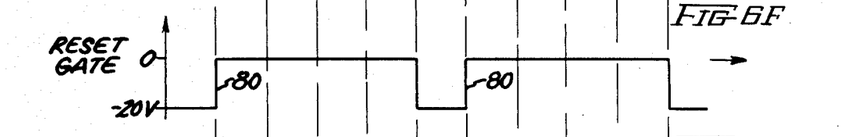
Figure 6G:
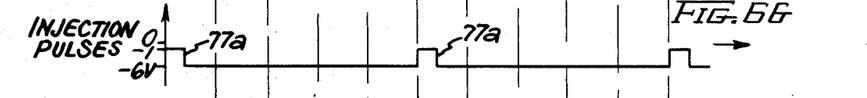
Figure 6H:
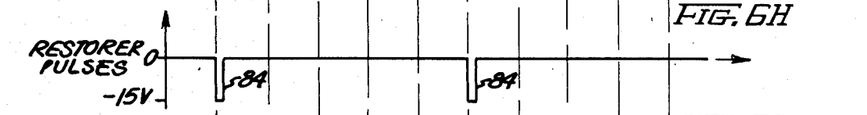

The gates of the reset transistor 73 and 75 are connected together and to the output of the reset gate generator 79 on which appears the voltage pulses 80 of FIG. 6F synchronized with the X-axis clock pulses. During the reset interval of pulse 80 the voltages appearing at the output of the AND gates 74 and 76 are applied to the terminals 65b and 65a to enable readout of the devices in each of the rows, as will be explained below.

A charge pump generator 96 is provided, the input of which is synchronized with the X-axis clock pulses. The charge pump generator 96 is controlled by the charge pump controller 97. A charge pump switch controller 98 is provided with an input terminal connected to the output of reset gate generator 79 and a linkage indicated by dotted line 98a connected to the pole of switch 95 for controlling the position thereof to make contact with either the first contact terminal 95b or the second contact terminal 95c in response to an appropriate control signal applied to the input terminal thereof as will be described below.

The output of the differential amplifier 70 is connected through a capacitor 81 and the source drain conduction path of transistor 82 to ground. The gate of the transistor 82 is connected to the output of restorer circuit 83 which is synchronized with the X-axis clock pulses and provides restorer pulses 84, shown in FIG. 6H, which are utilized to reference the output of the differential amplifier at the beginning of each row of scan. The output of the differential amplifier 70 is coupled through the capacitor 81 to the amplifier 85, output from which is obtained at terminal 86.

The gate electrodes of the transistor pairs 61a and 64b, 62a and 61b, 63a and 62b, 64a and 63b are connected to successive output terminals of the row shift register 87, numbered respectively 1, 2, 3 and 4. The outputs at terminals 1 and 2 of the row shift register are shown, respectively, in FIGS. 6D and 6E. The outputs at terminals 3 and 4 are similar to output of terminal 1 except appropriately delayed in time to occur during the third and fourth row line scan periods, respectively. The input to row shift register 87, referred to as the frame sync pulse, is the pulse obtained at the output of the second counter 55. One frame sync pulse occurs for every 20 Y-axis clock pulses. Oppositely phased clock drive pulses for the row shift register 87 are derived from the X-axis clock pulses. The oppositely phased drive line pulses are applied to each of the stages of the row shift register 87 to produce the indicated outputs at the terminals 1–4 thereof. The row shift register 87 may be any of a number of shift registers known to the art. The elements of the shift register 87 may be concurrently formed on the substrate at the same time that the devices of the array 20 are formed.

During the occurrence of the gating pulses of FIG. 6D on terminal 1 of the row scanner 87, transistors 61a and 64b are turned on, connecting row $X_1$ to terminal 65a and connecting row line $X_4$ to terminal 65b. Prior to the instant of time $t_o$, the devices of row $X_4$ have been read out and the charge stored in these devices has been injected into the substrate by the occurrence of an injection pulses 77a of FIG. 6G at the output of the AND gate 74 during the reset interval of pulse 80 of FIG. 6F. At the instant of time $t_1$, after the occurrence of reset pulses 80 applied to reset switches 73 and 75, the voltage on the lines $X_4$ and $X_1$ is set at −6 volts and any charge in the devices of row $X_4$ and $X_1$ is now located in the column cells of the devices, the column lines being at −10 volts as will be described below.

The pulses appearing on the column lines $Y_1$ to $Y_4$ to effect readout are shown, respectively, in FIGS. 6R through 6U. The pulse applied to column line $Y_1$ raises voltage thereof to −1 volt corresponding to the threshold voltage of the column capacitor during the interval $t_1$ to $t_2$. Similarly, the column lines $Y_2$ through $Y_4$ are raised to $-1$ volt during intervals $t_2$ to $t_3$, $t_3$ to $t_4$, $t_4$ to $t_5$, respectively. The first device in the first row $X_1$ is read out by the rise in potential of the $Y_1$ line to $-1$ volt which causes charge stored in the column cell to transfer into the row cell of the first device. The transferred charge is sensed on terminal 65a connected to line $X_1$, thru transistor 61a. Simultaneously, the signal on line $X_4$ due to the transfer of charge in the column cell of the first device in the fourth row into the row cell thereof is sensed on terminal 65b. As terminal 65a is connected to the noninverting terminal of the differential amplifier 70 and as terminal 65b is connected to the inverting terminal of the differential amplifier 70, an output is obtained from the amplifier which is the difference of the two signals. The other devices of the rows $X_1$ and $X_4$ are similarly sensed and differential outputs obtained. This mode of sensing eliminates components in the resultant signals which are due to geometrical nonuniformities in the devices of the array and which are referred to as pattern noise. At the end of the period of scan of the devices of rows $X_1$ and $X_4$, the reset pulse 80 of FIG. 6F is applied to the gates of the reset transistors 73 and 74 which allows the injection pulses 77a of FIG. 6G to appear on terminal 65b and raise the potential of the $X_1$ line to $-1$ volt to cause injection of the stored charge into the substrate. As will be explained below, during the interval of time that the row line $X_1$ is raised to $-1$ volt the voltages on the column lines which are at $-10$ volts are raised to $-1$ volt to enable injection of the charge stored in the devices of the row $X_1$ into the substrate.

To reestablish storage voltage on all of the row lines, row reset switches 91–94 are provided. The reset switches 91–94 are in the form of MOSFET transistors integrally formed on the substrate 50, each having a drain electrode connected to the other end of a respective one of the row conductor lines $X_1$–$X_4$ and each having a source electrode connected to the negative terminal of source 95 which provides 6 volts, the positive terminal of which is connected to ground. Each of the gate electrodes of the transistor 91–94 is driven by a common drive signal 98 shown in FIG. 6I obtained from the output of row gate generator 99 and synchronized with the X-axis clock pulses of FIG. 6B.

Figure 6I:
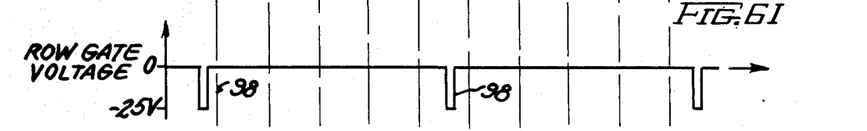
Figure 6J:
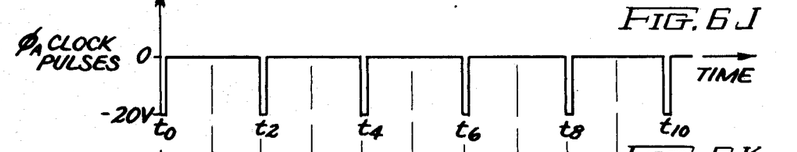
Figure 6K:
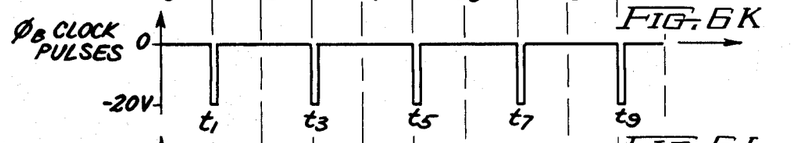

Note that the time of the occurrence of the row gating pulse 98 of FIG. 6I occurs subsequent to the occurrence of the injection pulse 77a of FIG. 6G which occurs during the reset gate pulse 80 of FIG. 6F. The occurrence of the reset gate pulse 80 of FIG. 6F extends beyond the time of occurrence of the row gate pulse 98 of FIG. 6I. Accordingly, when the row gate voltage of FIG. 6E appearing on terminal 2 of the row scanner 87 goes negative and turns on the row enable switches 61b and 62a, the read out potential of $-6$ volts from the AND gates 74 and 76 appears on row line $X_1$ and also on row line $X_2$. The lines $X_1$ and $X_2$ remain at these potentials when the reset switches 74 and 76 are turned off. It should be noted that the row lines other than $X_1$ and $X_2$ are floated at $-6$ volts by row gate pulses 98 of FIG. 6I. The devices of row $X_2$ are read out in the same manner in which the devices of row $X_1$ are read out. In this case, however, the row $X_1$ is connected through switch 61b to the inverting terminal 71 of the differential amplifier 70 and the row line $X_2$ is connected through transistor 62a to the noninverting terminal 72 of the differential amplifier 70.

To enable injection of charges from a row of devices which has just been scanned it is essential not only to drop the row line voltage to $-1$ volt but also to set the column line voltages to $-1$ volt for a short interval of time as pointed out above. This latter function is performed by the column line switches 101 through 104 in the form of MOSFET transistors integrally formed on the substrate and each having a source electrode, a drain electrode and a gate electrode. Each of the drains of the devices 101 and 104 is connected to one end of a respective one of the column lines $Y_1$ thru $Y_4$ and each of the sources is connected to the column drain terminal 105 which in turn is connected to the pole terminal 95a of switch. When the pole of switch 95 contacts terminal 95b the drains of devices 101 through 104 are connected to the output of the injection pulse generator 77. Each of the gates of the devices 101–104 is connected to gate terminal 108 which in turn is connected to the output of the reset gate generator 79. Thus, during the occurrence of the reset gate pulses 80 of FIG. 6F and the injection pulse 77a of FIG. 6G, the column lines $Y_1$–$Y_4$ are at $-1$ volt thereby enabling the injection into the substrate of charge stored in the devices of the row just read. The sensing of the charge stored in the devices of row $X_3$ and row $X_4$ is accomplished in a manner similar to the manner in which the sensing of the charge stored in rows $X_1$ and $X_2$ is accomplished.

The column line pulses of FIGS. 6R thru 6U are provided by the first column drive generator 109 and the second column drive generator 110 through a plurality of column line drive switches in the form of MOSFET transistors. 111–114. Each of the transistors 111–114 has a drain electrode connected to the other end of a respective one of the column lines $Y_1$ thru $Y_4$. The source electrodes of the odd numbered transistors 111 and 113 are connected to the first column drive generator 109 and the sources of the even numbered transistors 112 and 114 are connected to the second column drive generator 110. The pulses provided at the output of the first column drive generator 109 and the second column drive generator 110 are shown respectively in FIGS. 6L and 6M. The first column drive generator provides a 9 volt pulse from a base reference of $-10$ volts during intervals $t_1$–$t_2$ and $t_3$–$t_4$. The second column drive generator provides a 9 volt pulse from a $-10$ volts base during intervals $t_2$–$t_3$ and $t_4$–$t_5$. The gates of the transistors 111–114 are connected respectively to terminals 1–4 of the column scanner 116. The outputs of the column scanner 116 at terminals 1–4 are shown in FIGS. 6N–6Q, respectively. The sequentially occurring pulses from the output terminals of the column scanner overlap, that is, the outputs from terminals 1 and 2 are both ON during the interval $t_1$–$t_2$, the outputs from terminals 2 and 3 are both ON during the interval $t_2$–$t_3$, and the outputs from terminals 3 and 4 are both on during the interval $t_3$–$t_4$. Thus, during the switching of column drive pulses occurring at the instant $t_2$ the voltage on line $Y_1$ (FIG. 6L) drops from $-1$ volt to $-10$ volts and the voltage on line $Y_2$ (FIG. 6M) rises from $-10$ volts to $-1$ volt. With the drop in voltage on line $Y_1$ balanced by the rise in voltage on line $Y_2$, the coupling of voltages from the column lines $Y_1$ and $Y_2$ to the row lines is minimized. Similar column voltage balancing occurs at instants $t_3$ and $t_4$. Also, any voltages capacitively coupled from the column lines to a pair of row lines which are connected to the input of differential amplifier 70 would be rejected. In view of the fact that they are common mode signals as the change in voltage on column one line is balanced by the change in voltage on an adjacent column line, the need for special output sampling circuits is eliminated. Concurrently the noise band width requirement of the read out circuit of the apparatus is reduced.

Figure 6L:
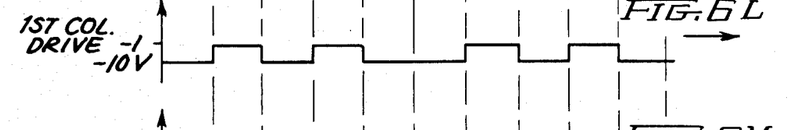
Figure 6M:
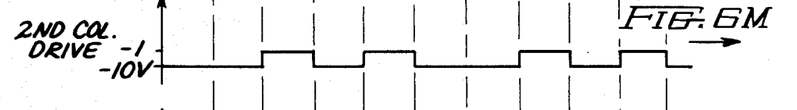
Figure 6N:
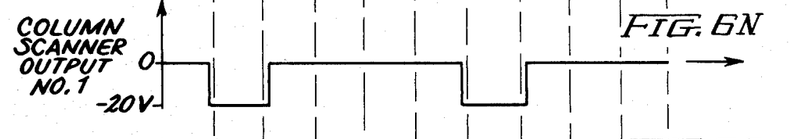
Figure 6O:
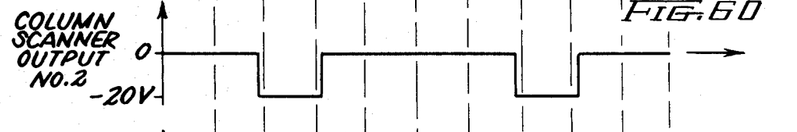
Figure 6P:
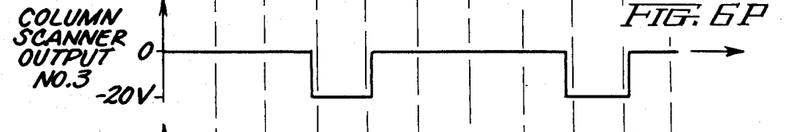
Figure 6Q:
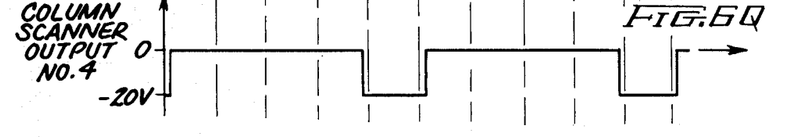
Figure 6R:
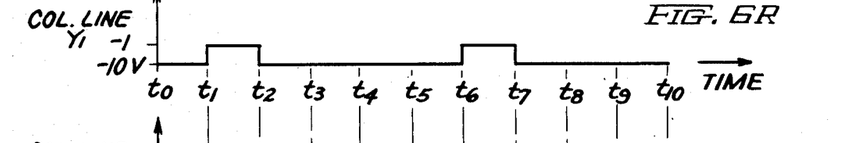
Figure 6S:
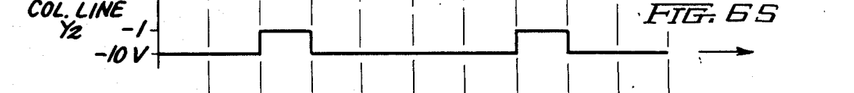
Figure 6T:
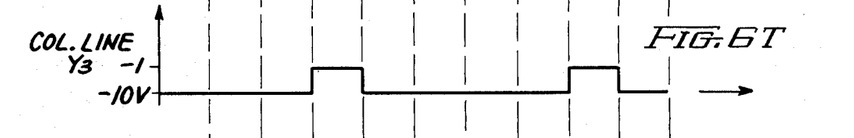
Figure 6U:
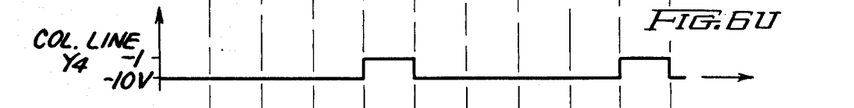

The amplitude of the column drive pulses of FIGS. 6L and 6M obtained at the output of the first column drive generator 109 and the second column drive generator may be either 9 volts or 10 volts depending on the mode of operation desired. When the column drive pulses are 9 volts the column line capacitors are just above threshold voltage which is assumed to be $-1$ volt and hence charge trapped in the interface is not released to the substrate and no charge is lost in the readout operation. When the column line drive pulses are 10 volts, the column line capacitors are driven below threshold voltage and hence charge trapped in the interface states are released to the substrate and is lost in the readout operation. The control of the amplitude of the drive pulses is provided by a one volt d-c source 121 having a negative terminal 121a and a positive terminal 121b, and single pole double-throw switches 122 and 123 connected to the first and second column line drive generators 109 and 110. The switch 122 has a pole terminal 122a connected to first column drive generator 109, a first contact terminal 122b connected to negative terminal 121a of source 121 and a second contact terminal 122c connected to positive terminal 121b of source 121. The switch 123 has a pole terminal 123a connected to second column drive generator 110, a first contact terminal 123b connected to negative terminal 121a of source 121, and a second contact terminal 123c connected to positive terminal 121b of source 121.

A column drive switch controller 125 is provided with an input terminal connected to the output of the clock pulse generator which provides Y-axis clock pulses and output linkages indicated by dotted lines 125a and 125b. Linkage 125a is connected to the pole of switch 122 for controlling the position thereof to make contact with either the first contact terminal 122b or the second contact terminal 122c in response to an appropriate control signal obtained from column drive switch controller 125. Linkage 125b is connected to the pole of switch 123 for controlling the position thereof to make contact with either the first contact terminal 123b or the second contact terminal 122c in response to an appropriate control signal obtained from drive switch controller 125.

To provide the outputs of FIG. 6N thru 6Q at the terminals 1-4 of the column scanner 116 line synchronizing pulses from the output of counter 53 are applied to the input of the column scanner 116, and in addition, pulses from the $\phi_A$ generator 118 and the $\phi_B$ generator 119, shown respectively in FIGS. 6J and 6K, are applied. The $\phi_A$ generator 118 applies the even numbered pulses of the clock pulse generator 51 to the column scanner 116 and the $\phi_B$ generator 119 applies the odd numbered pulses of the clock pulse generator 51 to the column scanner 116. From the applied input information the column scanner develops the outputs 6N thru 6Q at the output terminals 1-4 thereof.

As mentioned above, the selected pair of rows of devices is read out by resetting the selected pair of row lines to their readout level of voltage of $-6$ volts and allowing the row lines to float, any uncertainty in the voltage appearing on the selected lines when the switches 73 and 75 are opened will appear at the output of the amplifier as an interferring signal. To minimize this interferring signal or noise, the restorer circuit including the capacitor 81, the transistor 82, and the restorer 83 are provided. After the reset switches 73 and 75 are closed by the return of the reset gate voltage of FIG. 6F to zero, the restorer pulse of FIG. 6H is applied to the gate of the transistor 82 to absorb the interferring signal across capacitor 81. In subsequent sensing of devices on the selected rows, the net output voltage of the differential amplifier 70 has subtracted from it the noise voltage on capacitor 81, and accordingly the input voltage applied to the amplifier 84 is relatively free of this component of noise.

Figure 6V:
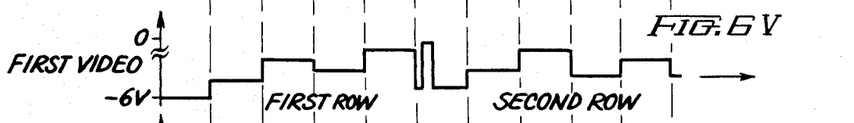
Figure 6W:
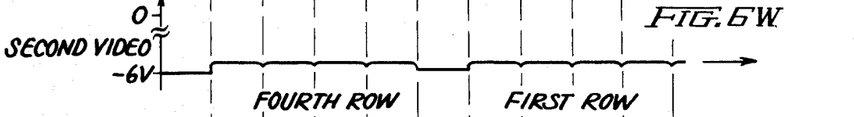
Figure 6X:
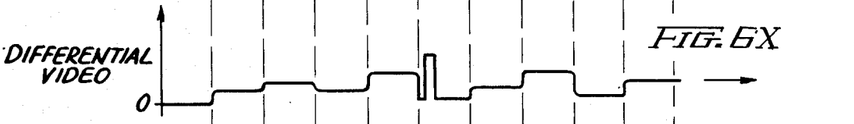
Figure 6Y:
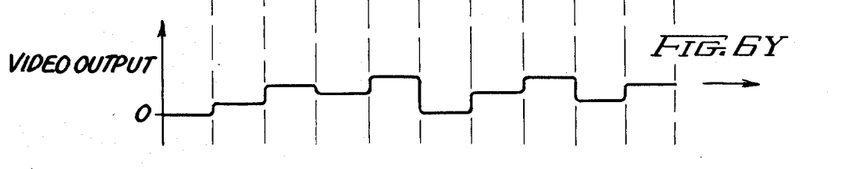

The scanning of the devices of row $X_1$ and row $X_2$ of the array in accordance with the present invention provides a first video signal at terminal 65a such as shown in FIG. 6V and also provides a second video signal at terminal 65b such as shown in FIG. 6W. On the basis of the assumption that the charge levels in the devices of the first or $X_1$ row are in the relative proportions of 1, 3, 2, 4, respectively, and the charge levels of the devices in the second or X row are in the relative proportions of 2, 4, 1, 3, respectively, the video voltage on terminal 65a for the two rows is as shown. The first half of the second video signal of FIG. 6W shows the signal sensed in the empty devices of the fourth row and the second half of the video signal of FIG. 6W shows the signal sensed in the empty devices of the first row. The differential amplifier 70 takes the difference of the voltages of FIGS. 6V and 6W and provides the differential video voltage shown in FIG. 6X. The amplified video, shown in FIG. 6Y, appears at the output of amplifier 84. The pulse 88 appearing in the interval $t_5-t_6$ of the first video signal of FIG. 6V is produced by charge injection at the end of a row of scan and is removed in the video output of FIG. 6Y by the amplifier 85.

The operation of the apparatus of FIG. 5 will be described initially when operated in a non-charge pumping mode and thereafter in charge pumping modes. In the non-charge pumping mode the switch 95 is set by charge pumping switch controller 98 so that the pole of switch 95 is in a first position with connection between pole terminal 95a and first contact terminal 95b. Switch 122 is set by column drive controller 125 so that the pole of switch 122 is in a first position with connection between pole terminal 122a and first contact terminal 122b. Switch 123 is set by column drive controller 125 so that the pole of switch 123 is in a first position with connection between pole terminal 123a and first contact terminal 123b. Thus, the injection pulse waveform of FIG. 6G, the column drive waveforms shown in FIGS. 6L and 6M and the column line waveforms of FIGS. 6R, 6S, 6T and 6V are produced in the operation of the apparatus.

In the operation of the apparatus the voltage of the row line source 95 which is shown as $-6$ volts establishes a charge storage capability of the row connected oriented cells of each of the devices of the array and the base voltage of $-10$ volts of the outputs of the first column drive generator and the second column drive generator shown in FIG. 6L and 6M establishes the charge storage capability of the column connected or oriented cells of each of the devices of the array. Under the control of the clock pulse generator, frame synchronizing pulses such as shown in FIG. 6C, are applied to the row scanner 87. Line interval gating pulses, two of which are shown for lines $X_1$ and $X_2$ in FIGS. 6D and 6E, respectively, are derived at the output points 1-4 of the row scanner 87 in response to line rate clocking of the row scanner by the X-axis clock pulses. The line interval gating pulses are utilized to gate in sequence the pairs of row enable switches 61a and 64b, 62b, 61b, and 63a and 62b, 64a and 63b to apply in sequence the readout voltage level appearing on terminals 65a and 65b to sequential pairs of row lines $X_1$-$X_4$.

The readout voltage level of −6 volts is applied to the terminals 65a and 65b through reset switches 73 and 75 which are turned on at the end of a row scan operation to apply the outputs of the AND gates 74 and 76, the output levels of which are −6 volts, to the terminals 65a and 65b and hence to a pair of row lines. As pointed out above, during the reset interval of the pulse 80 (FIG. 6F) one of the pair of row lines is raised (pulse 77a of FIG. 6G) to −1 volt by action of the injection circuit 77 and the odd-even selector circuit 78 to empty that row of the pair of rows which has been read out. During the injection interval the voltage of the column line Conductors $Y_1$-$Y_4$ through the action of the switches 101 thru 104 is maintained at −1 volt. Thus, during the reset gate interval of pulse 80 of FIG. 6F, the charge stored in the row of devices just sensed is injected into the substrate.

The switching actions that take place in the transition from the readout of one row to the readout of the next row will be explained in connection with the transition from the first or $X_1$ row to the second or $X_2$. Prior to turning off of row enable switches 61a and 64b, injection pulse 77a of FIG. 6G raises the potential of the line $X_1$ to −1 volt and concurrently the action of the pulses of FIG. 6F and 6G applied to the column injection switches 101-104 raises the column line voltage to −1 volt. Accordingly, the stored charge which had just been sensed on the first row line is injected into the substrate. After devices 61b and 62a are turned on, the row gate voltage pulses 98 of FIG. 6I applied to the row reset switches 91 thru 94 resets the row lines to −6 volts and floats them. However, as the reset switches 73 and 75 are open for the entire interval $t_5$-$t_6$ the final voltage appearing on row lines $X_1$ and $X_2$ on closing of the reset switches 73 and 75 is the readout bias voltage of −6 volts from the AND gates 74 and 76. Thus rows $X_1$ and $X_2$ are set up to read out with row $X_1$ being empty of charge.

Readout of the devices of the second row is accomplished by applying successively the pulses shown in FIGS. 6R thru 6U to the column lines $Y_1$ thru $Y_4$. Successively, the voltage on the column lines is raised to −1 volt and then dropped to the storage potential of −10 volts to cause transfer of charge from the column connected cell to the row-connected cell and back again to the column-connected cell. Each such transfer of charge into a row cell causes a change in the voltage on the row lines $X_1$ and $X_2$. The difference in voltage on the row lines is obtained by the differential amplifier 70 which provides a differential video output. The differential video output is amplified by amplifier 84 to provide the video output of FIG. 6Y.

Figure 7A:
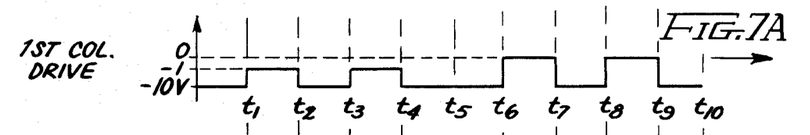
FIGS. 7A–7G are diagrams of amplitude versus time of voltage signals occurring at various points in the apparatus of FIG. 5 in other modes of operation thereof in accordance with the present invention.
Figure 7B:
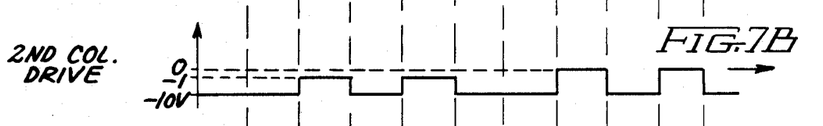
Figure 7C:
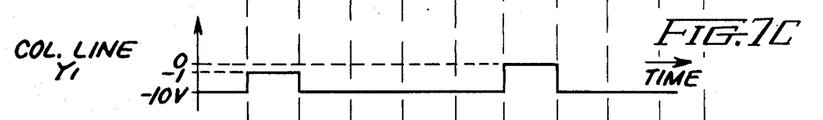
Figure 7D:
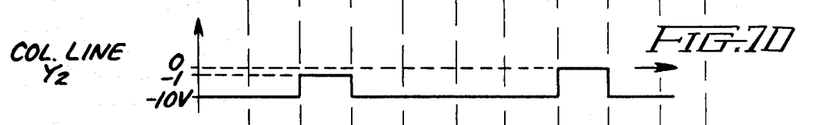
Figure 7E:
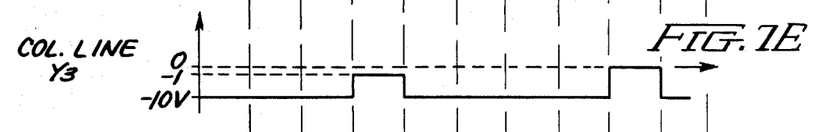
Figure 7F:
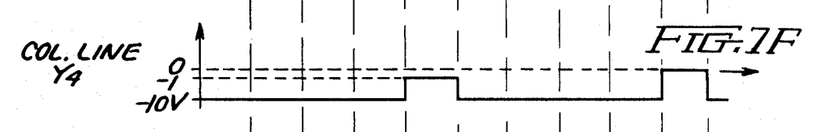

A first charge pumping mode of operation of the apparatus of FIG. 5 will now be described. For this mode of operation the pole of switch 122 is set in its second position with pole contact 122a connected to second contact terminal 122c during the interval from $t_5$ thru $t_{10}$. During the remainder of a cycle of operation of the array the pole of switch 122 is set in its first position with pole contact 122a making contact with contact terminal 122b. Similarly, the switch 123 is set with its pole in the second position with pole contact terminal 123a making contact with second contact terminal 123c during the time interval $t_5$ thru $t_{10}$. During the remainder of a cycle of operation of the array the pole of switch 123 is set in its first position with pole contact 123a making contact with contact terminal 123b. This action of the switches is provided by programming the column drive switch controller to provide this operation. Also, the switch is set in its first position during an entire cycle of operation of the array with connection being made between first contact terminal 95a and second contact terminal 95b in response to an appropriate control signal obtained from charge pump switch controller 98. In this mode of operation, the column drive voltages produced are shown in FIGS. 7A and 7B and the column line waveforms of FIGS. 7C, 7D, 7E and 7F are produced in the operation of the apparatus. Note that in this mode of operation during the time period $t_5$ thru $t_{10}$ the column line drive voltages, that is the pulses are of 10 volts amplitude and hence extend from −10 volts to zero thereby enabling the charge pumping action described above to occur. In this mode of operation, during the readout of a row of devices, in this case a second row of devices, each of the column lines $Y_1$ thru $Y_4$ is raised in potential to zero volts and then returned to −10 volts in sequence. In this operation, the voltage across each of the devices of a column is reduced to zero thereby enabling charge stored in the interface states of the column capacitors to combine with substrate charge. Thus, during the scanning of the devices of the second row of the array, not only is a quantity of the charge stored in the devices of this row reduced by a fixed factor dependent on the charge captured in the surface states of the column capacitors of the devices, but the charge stored in each of the other column capacitors of the devices of the other rows is reduced by this fixed amount. Thus for the 4×4 array shown, in every fourth cycle the charge in the array is reduced by a fixed amount. If a larger quantity of charge is required to be reduced, the column drive switch controller can be controlled to remove the fixed quantity of charge from each of the column capacitors of the array during two, three or all of the cycles of row scan.

Figure 7G:
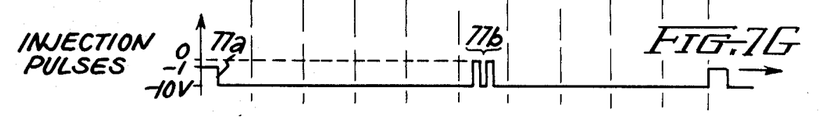

A second charge pumping mode of operation will now be described. In this mode of operation, pole contact 122a of switch 122 is connected to contact 122b and pole contact 123a of switch 123 is connected to first contact terminal 123b. The column drive voltages produced in this mode of operation are shown in FIGS. 6L and 6M and the column line voltages produced are shown in FIGS. 6R thru 6U. In all of these cases the column drive pulses extend to −1 volt and not to zero volts thus avoiding charge pumping operation in the readout of a row of devices of an array. The switch 95 is set into its second position with pole terminal 95a contacting second contact 95c. During the interval $t_5$ to $t_6$ in response to programming of charge pump switch controller the charge pump generator 96 is connected to terminal 95a and the injection pulse generator 77 is disconnected from terminal 95a. The charge pump generator 96 develops a waveform at its output terminal of the form shown in FIG. 7G. During the interval $t_5$-$t_6$ the charge pump generator in response to charge pump controller 97 provides a series of several pulses 77b, two of which are shown, each extending from a base level of −10 volts to zero volts. In the operation of the circuit in this mode, at the end of a scan of a row, the charge stored in each of the column storage capacitors of the devices of the array of the first row are injected into the substrate by reducing voltage on the column lines to zero volts instead of to −1 volt thereby releasing the charge trapped in the surface states of each of the column capacitors of the array thereby removing this charge from the devices of the array. In FIG. 7G two pulses 77b are shown. Accordingly, two charge pumping operations are provided thereby removing twice as much charge in the devices of the array as would be the case if just a single pulse were utilized. Of course, as many pulses may be provided as desired to remove the desired quantity of charge from each of the devices of the array. Either the first mode of charge pumping or the second mode of charge pumping may be utilized individually to remove the desired background charge. Also, first and second modes may be operated simultaneously, if desired.

An example will be described to illustrate the effectiveness of charge pumping to reduce background charge in an array. Consider an array in which each of the column capacitors has a plate or electrode area of $60 \times 10^{-8} cm^2$ and has a capacitance of 0.04 picofarads. With an effective voltage of 5 volts on each of the row capacitors (−6 volts applied less −1 volt threshold voltage) a row capacitor is capable of storing 1,200,000 electrons (or holes). Assume that the surface of silicon substrate utilized is a (100) crystallographic plane. Assume that the surface state density $N_{st}$ is about $10^{10}$ states per $cm^2$. Thus, each column capacitor has $10^{10} \times 60 \times 10^{-8}$ or 6000 states. Further, assume that each row of the array has 100 devices and also has 100 rows. Utilizing the first mode of charge pumping in which the full array is pumped during the scanning of a row of devices, one-two hundredth of the maximum charge storable in each of the row capacitors would be removed. Thus, one-half of the maximum charge storable could be removed if the array is pumped during every row of scan using the first charge pumping mode. Multiples of this amount of charge could be removed using the second mode of charge pumping. Thus, by controlling the number of times that the array is pumped during a cycle of operation thereof, any amount of charge desired can be removed. Of course, if a substrate is utilized having a different crystallographic surface, for example the (111) crystallographic surface, higher surface state densities occur and a greater amount of charge would be removed during each pumping operation. In such case, less frequent charge pumping of the array per cycle of operation of the array would be required to remove the same quantity of charge as when a substrate having a (100) crystallographic surface is utilized.

While in the operation of the apparatus described in the charge pumping modes, the value of the second voltage provided on the column lines for storage of charge in the column capacitors is greater than the value of the first voltage provided on the row lines for storage of charge in the row capacitors, the first and second voltages could be the same, if desired.

While the apparatus of the invention described in connection with FIG. 5 included the array of FIG. 1, it is apparent that other arrays, such as the array described in U.S. Pat. No. 3,882,531, assigned to the assignee of the present invention, and including a semiconductor substrate of one conductivity type having an epitaxial layer of the opposite type thereon, may be used.

While the invention has been described in connection with an array of sixteen devices, it is apparent that the invention is particularly applicable to arrays including a much larger number of devices. Also, the devices may be organized in arrangements other than the arrangement shown.

While the invention has been described in connection with an array constituted of an N-type conductivity substrate, a P-type conductivity substrate could as well be used. Of course, in such a case the applied potentials would be reversed in polarity.

While the invention has been described in specific embodiments, it will be understood that modifications, such as those described above, may be made by those skilled in the art, and it is intended by the appended claims to cover all such modifications and changes as fall within the true spirit and scope of the invention.

What is claimed is:

1. In combination, a substrate of semiconductor material having a major surface, a plurality of first conductive plates, each overlying and in insulated relationship to said major surface and forming a first conductor-insulator-semiconductor capacitor with said substrate, a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor, a plurality of row conductor lines, the first conductive plates in each of said rows connected to a respective row conductor line, a plurality of column conductor lines, the second conductive plates in each of said columns connected to a respective column conductor line, a first voltage means for providing a first voltage between said row conductor lines and said substrate to deplete respective first portions of said substrate lying thereunder of majority charge carriers and provide an absolute potential of a first value therein, a second voltage means for providing a second voltage between said column conductor lines and said substrate to deplete respective second portions of said substrate lying thereunder of majority charge carriers and providing an absolute potential of a second value therein, means for storing charge in said second portions of said substrate, means for reducing on each of the column conductor lines in sequence said second voltage to a first level and thereafter reestablishing said second voltage during a respective first period of time to cause said second portions of said substrate to be reduced in absolute potential to a third value less than said second value whereby charge in each of said second portions of said substrate transfers into a respective first portion of said substrate and back to said second portion, means for sensing in sequence the signals induced on a row line during the transfer of charge from said second portions to said first portions of said substrate associated with said row line during a second period of time, said third value being the potential of said substrate at which majority carriers in said substrate combine with charge trapped in the interface states so that a fixed quantity of each packet of charge transferred from a respective first portion to a respective second portion of said substrate functions to fill the states at the surface of a respective second portion of said substrate with charge thereby diminishing each packet of charge by said fixed quantity of charge.

2. The combination of claim 1 in which said second value of absolute potential is equal to said first value of absolute potential.

3. The combination of claim 1 in which said second value of absolute potential is greater than said first value of absolute potential.

4. The combination of claim 1 including
means for setting said third value of potential to be equal to a potential at least one threshold voltage of said column capacitors above substrate potential during readout of some of said rows of devices and for setting said third value of potential to be equal to substrate potential during readout of the remainder of said rows of devices whereby each packet of charge stored in the devices of said array are reduced by said fixed quantity of during the readout of each of said other rows of devices.

5. In combination,
a substrate of semiconductor material having a major surface,
a plurality of first conductive plates, each overlying and in insulated relationship to said major surface and forming a first conductor-insulator-semiconductor capacitor with said substrate,
a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor,
a plurality of row conductor lines, the first conductive plates in each of said rows connected to a respective row conductor line,
a plurality of column conductor lines, the second conductive plates in each of said columns connected to a respective column conductor line,
a first voltage means for providing a first voltage between said row conductor lines and said substrate to deplete respective first portions of said substrate lying thereunder of majority charge carriers and provide an absolute potential of a first value therein,
a second voltage means for providing a second voltage between said column conductor lines and said substrate to deplete respective second portions of said substrate lying thereunder of majority charge carriers and providing an absolute potential of a second value therein,
means for storing charge in said second portions of said substrate,
means for reducing on each of the column conductor lines in sequence said second voltage to a first level and thereafter reestablishing said second voltage during a respective first period of time to cause said second portions of said substrate to be reduced in absolute potential to a third value less than said second value whereby charge in each of said second portions of said substrate transfers into a respective first portion of said substrate and back to said second portion,
means for sensing in sequence the signals induced on a row line during the transfer of charge from said second portions to said first portions of said substrate associated with said row line during a second period of time,
means for reducing said second voltage on each of the column conductor lines at the end of said second period of time to the potential of said substrate and thereafter reestablishing said second voltage whereby a fixed quantity of each packet of charge transferred from a respective first portion to a respective second portion of said substrate functions to fill the states for charge at the surface of a respective second portion of said substrate thereby diminishing each packet of charge by said fixed quantity of charge.

6. The combination of claim 5 in which said second value of absolute potential is equal to said first value of absolute potential.

7. The combination of claim 5 in which said second value of absolute potential is greater than said first value of absolute potential.

8. The combination of claim 5 in which each of said column conductor lines is cycled several times at the end of said second period of time between said second value of absolute potential and the potential of said substrate.

* * * * *